(12) United States Patent
Lin

(10) Patent No.: US 7,807,034 B2
(45) Date of Patent: Oct. 5, 2010

(54) MANUFACTURING METHOD OF NON-ETCHED CIRCUIT BOARD

(75) Inventor: Ting-Hao Lin, Taipei (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 842 days.

(21) Appl. No.: 11/734,274

(22) Filed: Apr. 12, 2007

(65) Prior Publication Data

US 2008/0251386 A1    Oct. 16, 2008

(51) Int. Cl.
*C25D 5/02*    (2006.01)
(52) U.S. Cl. ........................................ 205/125; 205/181
(58) Field of Classification Search .................. 205/118, 205/125

See application file for complete search history.

(56) References Cited

U.S. PATENT DOCUMENTS 6,969,674 B2    11/2005    Chang et al. ................. 438/613

*Primary Examiner*—Luan V Van

(57) ABSTRACT

A manufacturing method of a non-etched circuit board is disclosed herein, which employs a metal substrate having a metal barrier layer and an electroplated copper layer to transmit an electrical current to form a circuit layer. A patterned photoresist layer is formed on the electroplated copper layer to define the location of the circuit layer and form circuits or conductive via on the board by electroplating. An electroplated nickel layer or an electroplated gold layer is further formed on the circuit layer for protecting the circuits and improving the fine line capability. During or after the process, the metal substrate, the metal barrier layer, and the electroplated copper layer are removed to enlarge the wiring space, so that a high-density circuit board can be obtained.

6 Claims, 7 Drawing Sheets

MANUFACTURING METHOD OF NON-ETCHED CIRCUIT BOARD

BACKGROUND OF THE INVENTION

1. Field of the Invention

The present invention generally relates to a manufacturing method of a circuit board, and in particular to a manufacturing method of a non-etched circuit board.

2. The Prior Arts

Since the trend toward small and light weight for electronic products as well as continuous enhancement of function, I/O ports of semiconductor chips are increased rapidly, and accordingly, chip packaging technologies are continuously undated. Nowadays in high-end IC products, the Flip-Chip technology has been adopted to squeeze numerous electrical connections into a small package.

Conventionally, a build up material, such as fiberglass prepreg, is applied to manufacture a fine line with a pitch of 50 μm. A copper foil with a thickness of 1.5-5.0 μm is used as a conductive plating pattern layer, and finally, the copper foil is etched with flash etching. As the copper foil needs to have a rough surface to couple with the glass prepreg, the etching amount on the copper foil has to be further increased. That causes the line width not to be further reduced after electroplated. Since the etching amount, due to the limitation on the thickness of the copper foil, cannot be reduced, the conventional method cannot manufacture the high-density fine line circuit board with a pitch below 50 μm.

Generally, when electroplating nickel/gold on a circuit layer of a packaging substrate, an electrical current needs to be transmitted into the substrate, particularly into the circuit layer for electroplating via a conductive line connected to the circuit layer. Although the electroplated nickel/gold layer can entirely cover the circuit layer, the conductive lines will still remain in the circuit board, which occupies the circuit board and thus reduces the wiring area. To solve the problem, the conductive lines have to be narrowed down. But this will result in a non-uniform thickness of the electroplated nickel/gold layer. Therefore, to narrow down the conductive lines is not a good way to increase the wiring density.

To enhance conductivity, reduce noise and increase wiring density, the design of NPL (non-plating line) was provided, which has no need to plate the lines on the surface of the circuit board. However, the wire bonding area still adopts the nickel/gold electroplating for better adherence. The wire bonding area may also adopt a chemical nickel/gold, but its reliability is relatively poor. Therefore, the GPP (gold pattern plating) process is usually used for manufacturing the circuit boards with the design of NPL, whose wire bonding area adopts the nickel/gold electroplating.

However, before performing the GPP process, since the electroplated nickel/gold layer is formed prior to the solder mask (SM) layer, the electroplated nickel/gold layer has a larger area than the SM layer. Besides, the SM layer and the electroplated nickel/gold layer have a worse adherence to each other; thereby, it does not meet with the demands of high reliability and heat resistance.

Except that the non-plating line (NPL) process is highly complex, special machines are required in electroplating a copper foil, and it is difficult to control the etching parameters after copper electroplating. These will result in a micro short during the reliability test, and thus an irretrievable loss.

No matter what kinds of non-plating line (NPL) processes, it still needs to perform a selective etching on a metal layer and define a non-etched metal layer as a circuit layer. However, in the current etching technologies, the etching processes are difficult to be precisely controlled; accordingly, they can not be employed to fabricate fine line circuit boards.

SUMMARY OF THE INVENTION

An objective of the present invention is to provide a manufacturing method of a non-etched circuit board, which employs a metal substrate having a metal barrier layer and an electroplated copper layer to transmit an electrical current to form a circuit layer. A patterned photoresist layer is formed on the electroplated copper layer to define the location of the circuit layer and form circuits or conductive via on the board by electroplating. An electroplated nickel layer or an electroplated gold layer is further formed on the circuit layer for protecting the circuits and improving the fine line capability. During or after the process, the metal substrate, the metal barrier layer, and the electroplated copper layer are removed to enlarge the wiring space, so that a high-density circuit board can be obtained. Furthermore, the method in accordance with the present invention does not need to employ the higher cost of semi-additive process (SAP) to fabricate fine lines.

To achieve the above-mentioned objective, the method in accordance with the present invention comprises the steps of: forming a metal barrier layer on a metal substrate; transmitting an electrical current via the metal barrier layer to form an electroplated copper layer on the metal barrier layer; forming a first patterned photoresist layer having a photoresist opening on the electroplated copper layer; transmitting an electrical current via the metal barrier layer or the electroplated copper layer to form a circuit layer on the electroplated copper layer within the photoresist opening; removing the first patterned photoresist layer; performing a surface treatment on surfaces of the electroplated copper layer and the circuit layer to increase surface areas of the electroplated copper layer and the circuit layer; hot pressing the metal substrate having the metal barrier layer, the electroplated copper layer and the circuit layer together with a dielectric layer onto a circuit board; removing the metal substrate to expose the metal barrier layer; removing the metal barrier layer to expose the electroplated copper layer; removing a portion of the electroplated copper layer and a portion of the dielectric layer of the circuit board to form a via on the circuit board, so that an internal circuit layer of the circuit board is exposed; transmitting an electrical current via a chemical copper layer and the electroplated copper layer to perform a via-filling plating process, and removing the electroplated copper layer to expose the circuit layer having an untreated surface.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

FIGS. 1A to 1F show circuits formed by non-etched techniques, while FIGS. 1G to 1P show an electrical connection between each layer according to a preferred embodiment of the present invention.

Figure 1A:
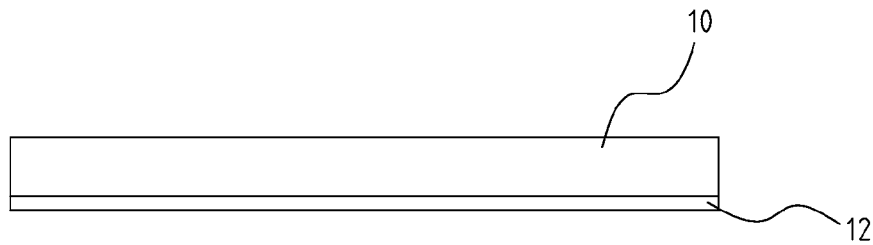
FIGS. 1A to 1P are cross sectional views showing a manufacturing method of a non-etched circuit board in accordance with a preferred embodiment of the present invention.
Figure 1B:
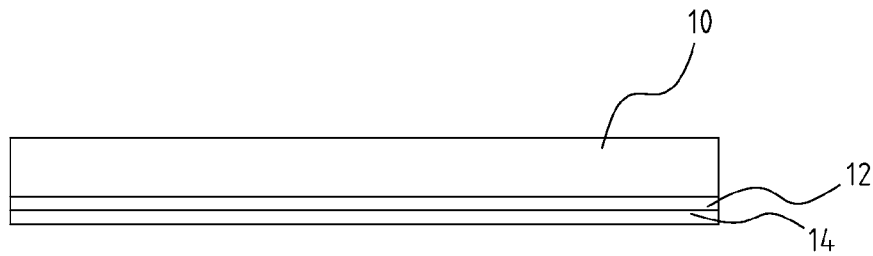
Figure 1C:
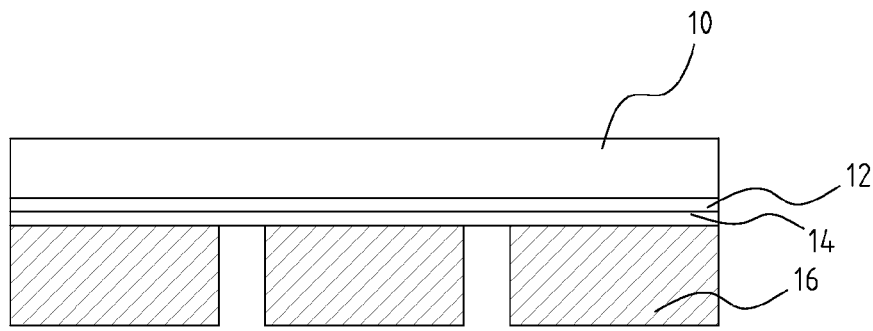
Figure 1D:
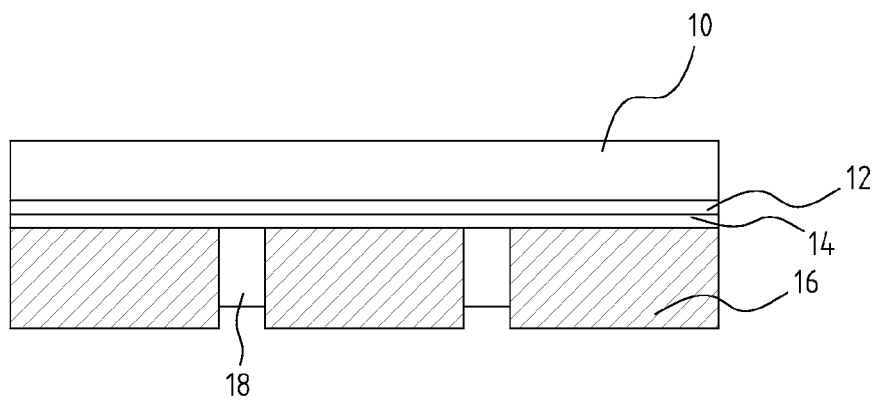

Referring to FIG. 1D, the manufacturing method of a non-etched circuit board according to the present invention employs a metal substrate 10 having a metal barrier layer 12 and an electroplated copper layer 14 to transmit an electrical current to form a circuit layer 18 by non-etched techniques. A patterned photoresist layer 16 is formed on the electroplated copper layer 14 to define the location of the circuit layer 18 and form circuits or conductive via on the board by electroplating. An electroplated nickel layer or an electroplated gold layer 30 is further formed on the circuit layer 18 for protecting the circuits and improving the fine line capability. During or after the process, the metal substrate 10, the metal barrier layer 12, and the electroplated copper layer 14 are removed to enlarge the wiring space, so that a high-density circuit board can be obtained. Furthermore, as shown in FIGS. 1A to 1F, the manufacturing method of the non-etched circuit board does not need to employ the higher cost of semi-additive process (SAP) to fabricate fine lines.

Referring to FIGS. 1A to 1F, the metal barrier layer 12 is formed on the metal substrate 10 as shown in FIG. 1A. Then the metal barrier layer 12 or the metal carrier 10 is used to transmit an electrical current to form an electroplated copper layer 14 on the metal barrier layer 12 as shown in FIG. 1B.

Figure 1E:
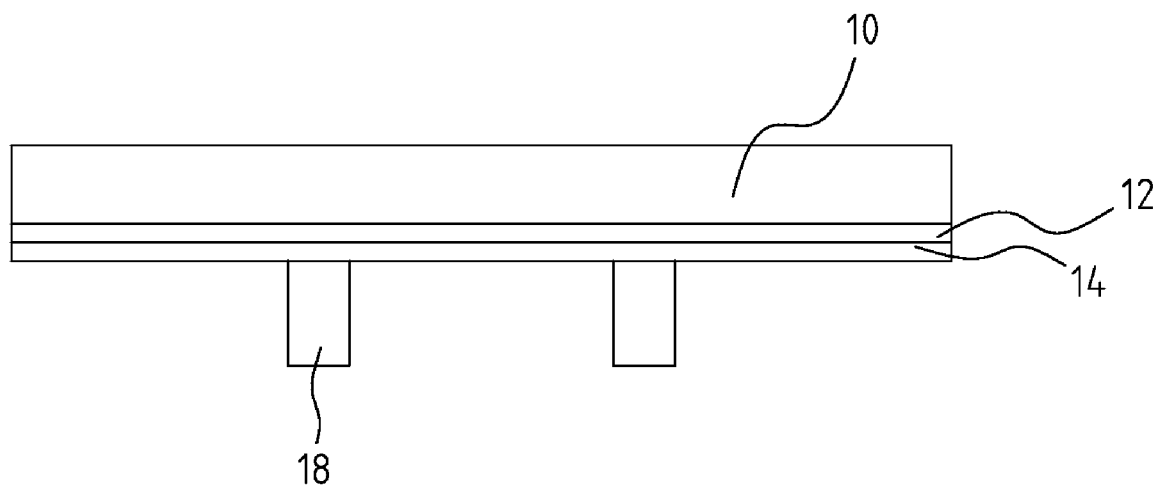
Figure 1F:
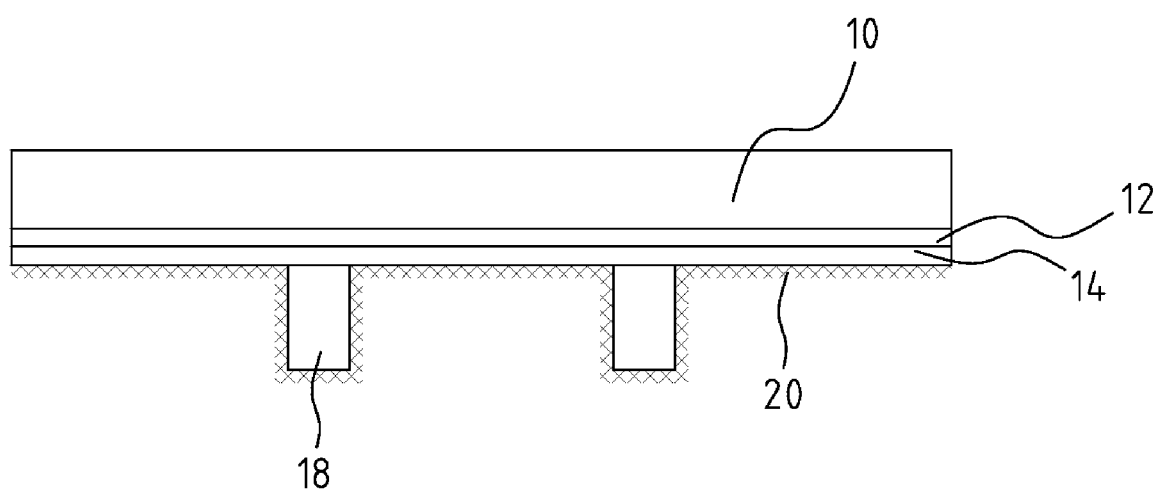

To form a circuit layer 18, a first patterned photoresist layer 16 having a photoresist opening is formed on the electroplated copper layer 14 as shown in FIG. 1C. The metal barrier layer 12 or the electroplated copper layer 14 is used to transmit an electrical current to form a circuit layer 18 by electroplating on the electroplated copper layer 14 within the opening of the first patterned photoresist layer, as shown in FIG. 1D. Thereafter, the first patterned photoresist layer 16 is removed as shown in FIG. 1E.

After forming the circuit layer 18, the metal substrate 10 having the metal barrier layer 12, the electroplated copper layer 14, and the circuit layer 18 is hot pressed onto a circuit board 24, so that the circuit layer 18 can be attached to a surface of the circuit board 24. Thereafter, the circuit layer 18 and an internal circuit layer 24a of the circuit board 24 are electronically connected by conventional techniques.

Before performing the hot pressing process, to enhance the stability of the attachment of the circuit layer 18 with the circuit board 24, the electroplated copper layer 14 and the circuit layer 18 is in advance surface-treated to increase the surface areas and roughness of the electroplated copper layer 14 and the circuit layer 18. The surfaces of the electroplated copper layer 14 and the circuit layer 18 may be roughened or provided with a plurality of micro copper bumps (copper nodules) 20 to increase the contact areas, whereby the circuit layer 18 can be stably fixed on the circuit board 24 after performing hot pressing process as shown in FIG. 1H.

Figure 1G:
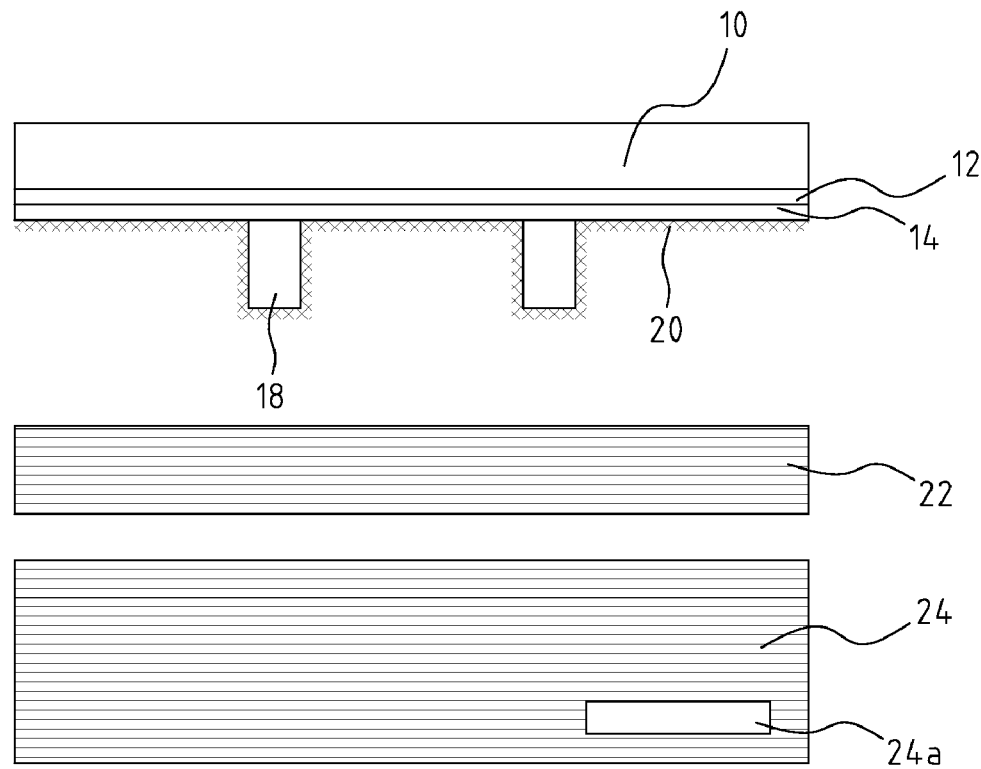
Figure 1H:
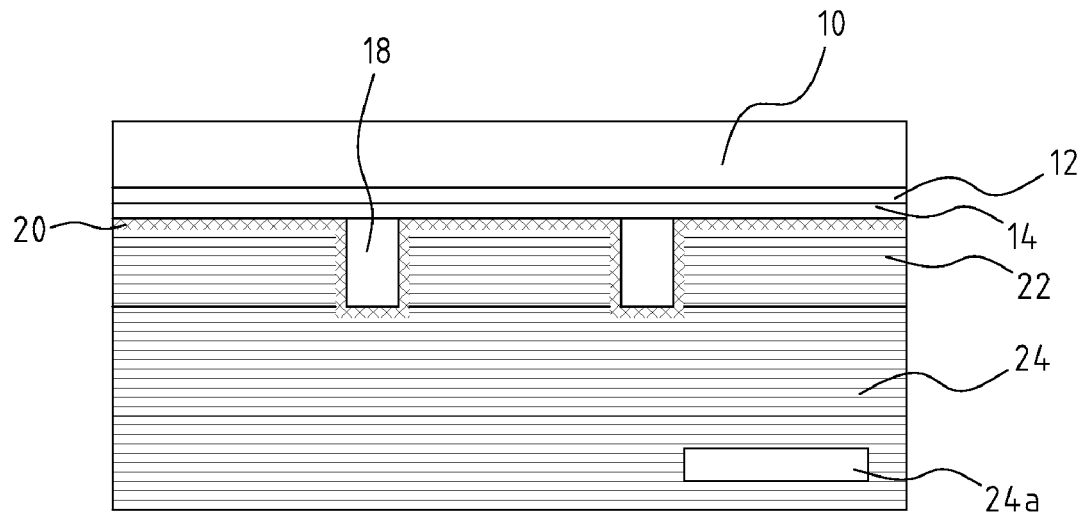

Referring to FIGS. 1G and 1H, the metal substrate 10 having the metal barrier layer 12, the electroplated copper layer 14 and the circuit layer 18 together with a dielectric layer 22 are hot pressed onto the circuit board 24.

Figure 1I:
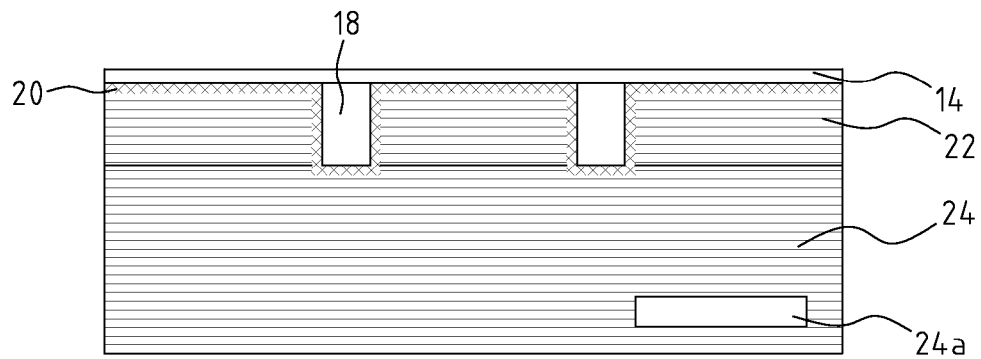

Referring to FIG. 1I, after finishing the hot pressing process of FIG. 1H, the metal substrate 10 is removed to expose the metal barrier layer 12, and then the metal barrier layer 12 is removed to expose the electroplated copper layer 14.

Figure 1J:
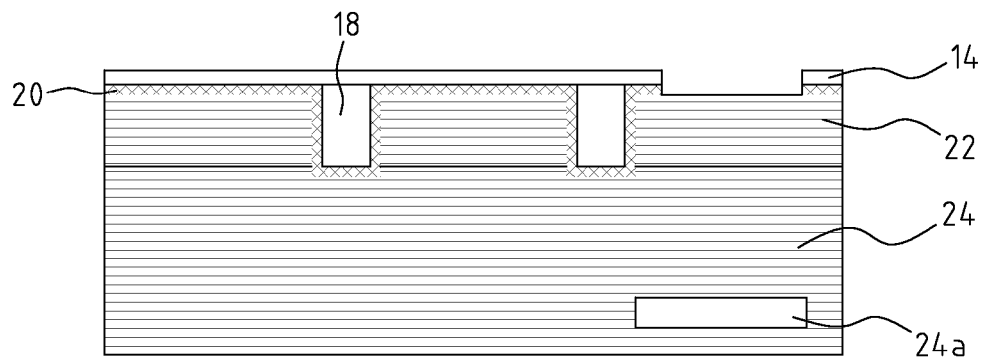
Figure 1K:
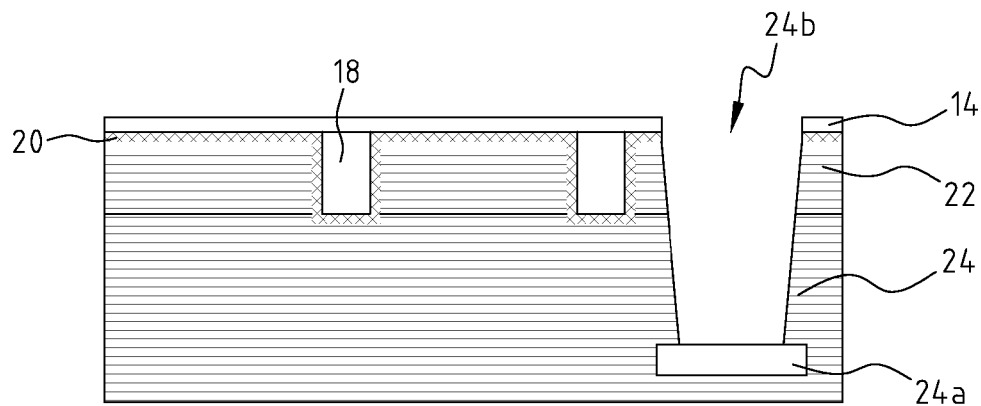
Figure 1L:
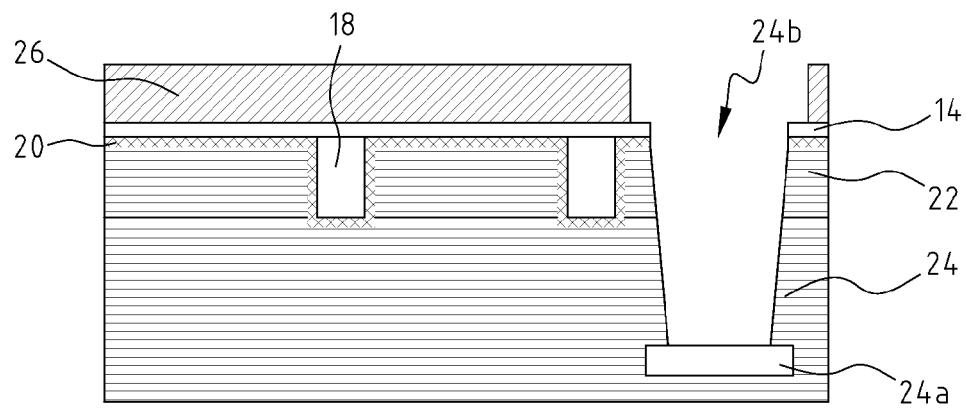
Figure 1M:
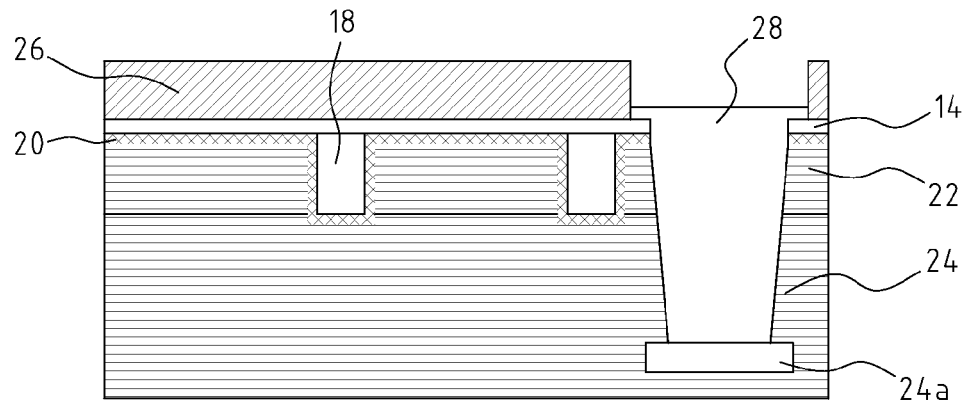
Figure 1N:
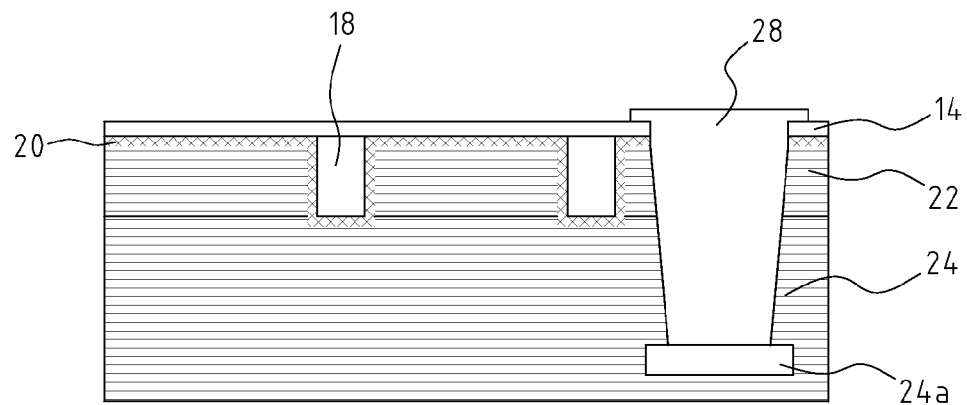
Figure 2:
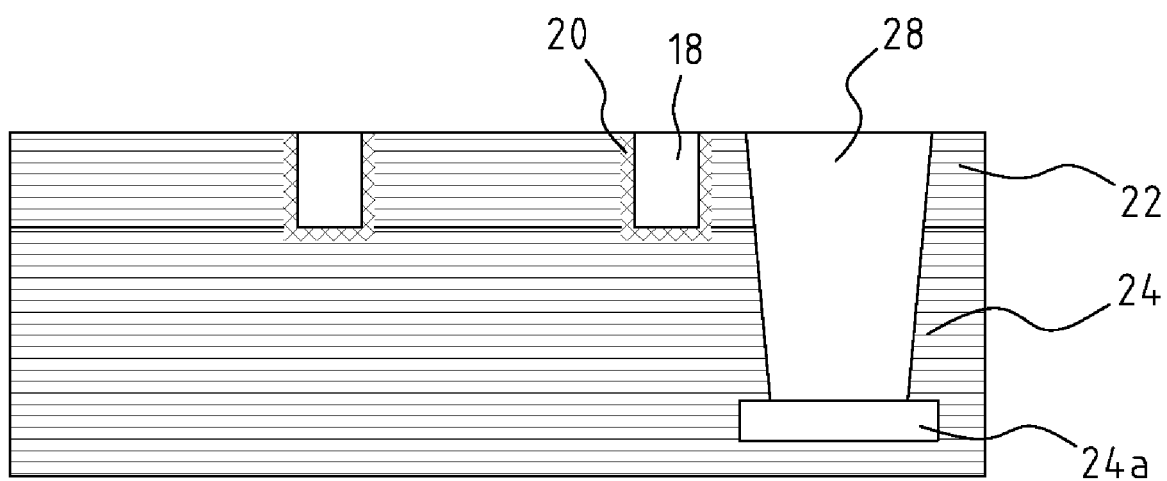
FIG. 2 is a cross-sectional view showing a manufacturing method of a non-etched circuit board in accordance with another preferred embodiment of the present invention.

Referring to FIGS. 1J-1K, a portion of the electroplated copper layer 14 and a portion of the dielectric layer of the circuit board 24 are removed to form a via 24b on the circuit board 24, so that the internal circuit layer 24a of the circuit board 24 is exposed as shown in FIG. 1L. Referring to FIG. 1N, a chemical copper layer and the electroplated copper layer 14 are used to transmit an electrical current to perform a via-filling plating process. Finally, the electroplated copper layer 14 is removed to expose the circuit layer 18 having an untreated surface as shown in FIG. 2.

The portion of the electroplated copper layer 14 and the portion of the dielectric layer of the circuit board 24 may be removed by laser drilling or mechanical drilling. When performing the via-filling plating process, the manufacturing method of the present invention further comprises the steps of forming a chemical copper layer on a wall of the via 24b, forming a second patterned photoresist layer 26 on the electroplated copper layer 14 without covering the via 24b as shown in FIG. 1M, transmitting an electrical current via the electroplated copper layer 14 to form a conductive post 28 within the via 24b, and finally removing the second patterned photoresist layer 26 as shown in FIG. 1N.

Figure 1O:
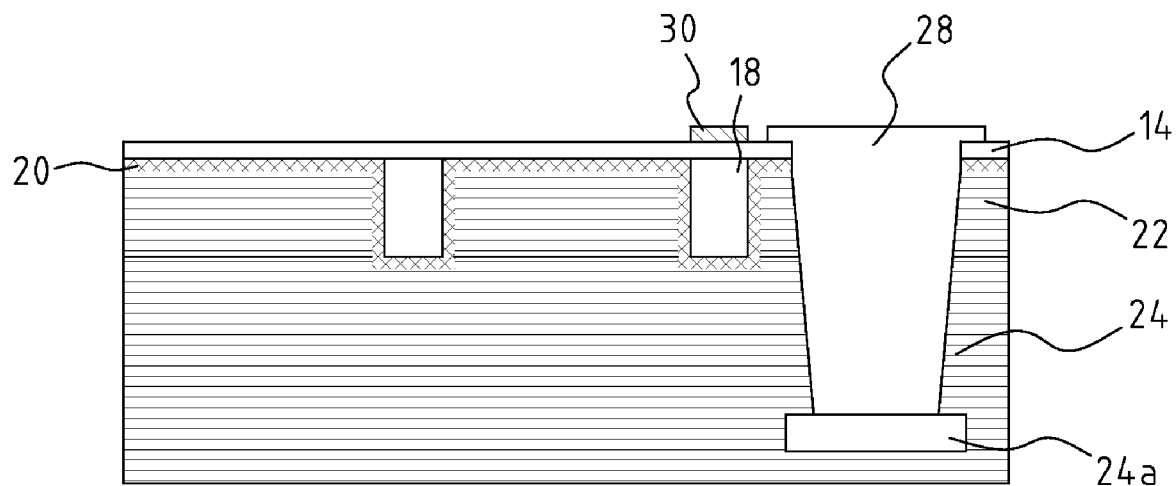
Figure 1P:
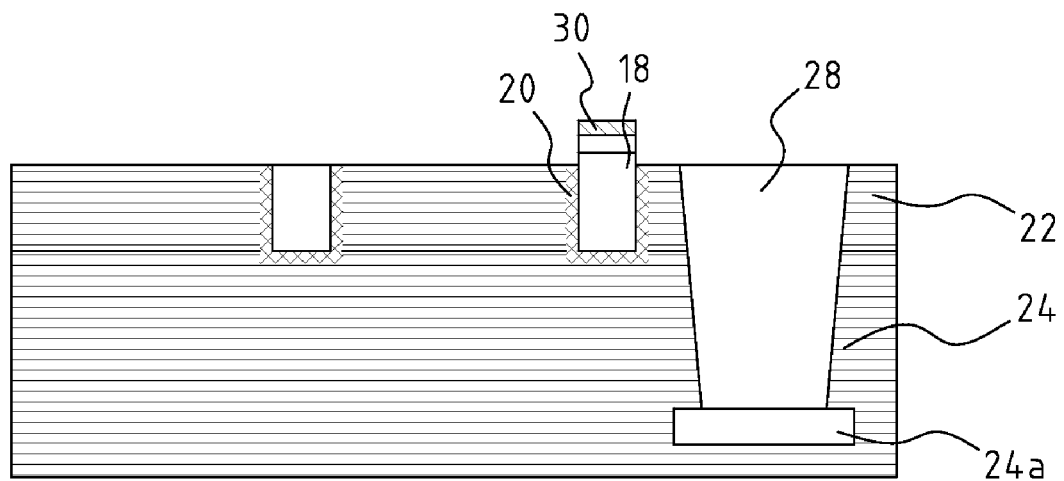

To further protect the circuit layer 18, an electroplated nickel layer or an electroplated gold layer 30 can be selectively formed on the circuit layer 18 as shown in FIG. 1P. Thus, before the step of removing the electroplated copper layer 14 as shown in FIG. 1P or 2, the electroplated copper layer 14 is used to transmit the electrical current to selectively form the electroplated nickel layer or the electroplated gold layer 30 on the circuit layer 18 as shown in FIG. 1O.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A manufacturing method of a non-etched circuit board, comprising the steps of:
    forming a metal barrier layer on a metal substrate;
    transmitting an electrical current via the metal barrier layer to form an electroplated copper layer on the metal barrier layer;
    forming a first patterned photoresist layer with a photoresist opening on the electroplated copper layer;
    transmitting an electrical current via one of the metal barrier layer and the electroplated copper layer to form a circuit layer on the electroplated copper layer within the photoresist opening;
    removing the first patterned photoresist layer;
    performing a surface treatment on surfaces of the electroplated copper layer and the circuit layer to increase surface areas of the electroplated copper layer and the circuit layer;
    hot pressing the metal substrate having the metal barrier layer, the electroplated copper layer and the circuit layer together with a dielectric layer onto a circuit board;
    removing the metal substrate to expose the metal barrier layer;
    removing the metal barrier layer to expose the electroplated copper layer;
    removing a portion of the electroplated copper layer and a portion of the dielectric layer of the circuit board to form a via on the circuit board, so that an internal circuit layer of the circuit board is exposed;
    forming a chemical copper layer on a wall of the via;
    transmitting an electrical current via the chemical copper layer and the electroplated copper layer to perform a via-filling plating process; and
    removing the electroplated copper layer to expose the circuit layer having an untreated surface.

2. The method as claimed in claim 1, wherein the surface treatment roughens the surfaces of the electroplated copper layer and the circuit layer, thereby increasing the surface areas of the electroplated copper layer and the circuit layer.

3. The method as claimed in claim 1, wherein the surface treatment forms a plurality of micro copper bumps on the surfaces of the electroplated copper layer and the circuit layer, thereby increasing the surface areas of the electroplated copper layer and the circuit layer.

4. The method as claimed in claim 1, wherein the step of removing a portion of the electroplated copper layer and a portion of the dielectric layer of the circuit board is performed by laser drilling or mechanical drilling.

5. The method as claimed in claim 1, wherein the step of performing the via-filling plating process further comprises the steps of:

forming a second patterned photoresist layer on the electroplated copper layer without covering the via;

transmitting an electrical current via the electroplated copper layer to perform the via-filling plating process; and removing the second patterned photoresist layer.

6. The method as claimed in claim 1, before the step of removing the electroplated copper layer, further including a step of transmitting an electrical current via the electroplated copper layer to selectively form an electroplated nickel layer or an electroplated gold layer on the circuit layer.

* * * * *